(12) United States Patent
Oh

(10) Patent No.: US 7,737,492 B2
(45) Date of Patent: Jun. 15, 2010

(54) SEMICONDUCTOR DEVICE FOR REDUCING INTERFERENCE BETWEEN ADJOINING GATES AND METHOD FOR MANUFACTURING THE SAME

(75) Inventor: Tae Kyung Oh, Jeju-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 48 days.

(21) Appl. No.: 12/033,154

(22) Filed: Feb. 19, 2008

(65) Prior Publication Data

US 2009/0159987 A1    Jun. 25, 2009

(30) Foreign Application Priority Data

Dec. 20, 2007    (KR) ..................... 10-2007-0134034

(51) Int. Cl.
*H01L 27/108* (2006.01)

(52) U.S. Cl. ................. 257/330; 257/224; 257/296

(58) Field of Classification Search ................. 257/330, 257/402, E21.409, E29.27, 773, 774
See application file for complete search history.

(56) References Cited

U.S. PATENT DOCUMENTS

| | | | |
|---|---|---|---|
| 6,844,591 B1 * | 1/2005 | Tran ........................... | 257/330 |
| 2005/0077568 A1 * | 4/2005 | Park et al. ................... | 257/330 |
| 2005/0173744 A1 * | 8/2005 | Kim et al. ................... | 257/296 |
| 2005/0186732 A1 * | 8/2005 | Yun ........................... | 438/253 |
| 2005/0230734 A1 * | 10/2005 | Ha et al. ..................... | 257/306 |
| 2006/0049445 A1 * | 3/2006 | Lee et al. ................... | 257/296 |
| 2006/0097314 A1 * | 5/2006 | Uchiyama ................... | 257/330 |
| 2006/0205162 A1 * | 9/2006 | Suh ........................... | 438/286 |

FOREIGN PATENT DOCUMENTS

| | | | |
|---|---|---|---|
| KR | 2001058136 A | * | 7/2001 |
| KR | 1020010058136 A | | 7/2001 |
| KR | 1020020018059 A | | 3/2002 |
| KR | 100650773 B1 | | 11/2006 |
| KR | 1020070114463 A | | 12/2007 |

* cited by examiner

*Primary Examiner*—Leonardo Andújar
*Assistant Examiner*—Jordan Klein
(74) *Attorney, Agent, or Firm*—Ladas & Parry LLP

(57) ABSTRACT

A semiconductor device includes a semiconductor substrate having an active region having a plurality of recessed channel areas extending across the active region and a plurality of junction areas also extending across the active region. Gates are formed in and over the recessed channel areas of the active region. A device isolation structure is formed in the semiconductor substrate to delimit the active region, and the device isolation structure has recessed portions, each of which is formed near a junction area of the active region. Landing plugs are formed over each junction area in the active region and extend to fill the recessed portion of the device isolation structure outside the active region. The semiconductor device suppresses interference caused by an adjoining gate leading to a decrease in leakage current from a cell transistor.

8 Claims, 6 Drawing Sheets

SEMICONDUCTOR DEVICE FOR REDUCING INTERFERENCE BETWEEN ADJOINING GATES AND METHOD FOR MANUFACTURING THE SAME

CROSS-REFERENCE TO RELATED APPLICATIONS

The present application claims priority to Korean patent application number 10-2007-0134034 filed on Dec. 20, 2007, which is incorporated herein by reference in its entirety.

BACKGROUND OF THE INVENTION

The present invention relates generally to a semiconductor device and a method for manufacturing the same, and more particularly, to a semiconductor device which reduces interference between adjoining gates and a method for manufacturing the same.

As the design rule of a semiconductor device decreases, limitations are encountered when attempting to attain a target threshold voltage using a conventional planar channel structure. As a result of the limitations, research has been directed towards a semiconductor device having three-dimensional recessed channels.

A semiconductor device having recessed channels is realized by recessing the channel forming areas of a semiconductor substrate and then forming gates in and over the recessed channel areas. A semiconductor device having recessed channels has advantages over a conventional semiconductor device having planar channels, including the advantage of an increased effective channel length allowing a required threshold voltage to be obtained.

In order to raise the integration level of a DRAM (dynamic random access memory), it is essential to decrease the size of a cell transistor. However, as the size of the cell transistor is decreased to raise the integration level, a problem arises in that the data stored in a cell is likely to be lost when interference is caused by the operation of a transistor in an adjoining cell. In an effort to remove the interference caused by the adjoining gate, a method of depositing a highly doped polysilicon layer around an active region and a local damascene method of keeping a field oxide region (on which a gate poly is to be deposited) from being etched have been disclosed in the art.

Conventional methods for removing the interference caused by an adjoining gate require that an additional bias voltage be supplied and also require additional processes, which in turn deteriorate the effectiveness of the conventional methods.

SUMMARY OF THE INVENTION

Embodiments of the present invention are directed to a semiconductor device that reduces the interference between adjoining gates and a method for manufacturing the same.

Additionally, embodiments of the present invention are directed to a semiconductor device which can reduce interference between adjoining gates through a simple process and a method for manufacturing the same.

Further, embodiments of the present invention are directed to a semiconductor device that reduces interference between adjoining gates, thereby improving the characteristics of the semiconductor device, and a method for manufacturing the same.

In one aspect, a semiconductor device comprises a semiconductor substrate having an active region having a plurality of recessed channel areas extending across the active region and a plurality of junction areas also extending across the active region, wherein any two recessed channel areas or any two junction areas in the active region are not contiguous; gates formed in and over the recessed channel areas of the active region; a device isolation structure formed in the semiconductor substrate to delimit the active region, wherein the device isolation structure has recessed portions, each of which recessed portion is formed near a junction area of the active region; and landing plugs, each of which is formed over each junction area in the active region and extends to fill the recessed portions of the device isolation structure outside the active region.

Recessed portions of the device isolation structure are near but separated from the junction areas in the active region.

A width of each recessed portion of the device isolation structure is in the range of 200~500 Å, and a depth of each recessed portion of the device isolation structure is in the range of 500~1,500 Å.

Each of the landing plugs is formed of a stack comprising a first conductive material formed on each junction area and a second conductive material formed on the first conductive material and in and over the recessed portions of the device isolation structure.

The first conductive material has a size greater than that of the junction area.

The first conductive material comprises an epi-silicon layer, and the second conductive material comprises a doped polysilicon layer.

The doped polysilicon layer has a concentration in the range of $1 \times 10^{20}$~$1 \times 10^{22}$ ions/cm$^3$.

A portion of the device isolation structure is interposed between the junction area and the second conductive material.

In another aspect, a method for manufacturing a semiconductor device comprises the steps of providing a semiconductor substrate having an active region having a plurality of channel forming areas extending across the active region and a plurality of junction forming areas also extending across the active region, wherein any two channel forming areas or any two junction forming areas in the active region are not contiguous; forming a device isolation structure in a semiconductor substrate to delimit an active region, thereby forming recessed channel areas; forming gates in and over the recessed channel areas of the active region; forming junction areas in the junction forming areas of the active region; forming an interlayer dielectric over the semiconductor substrate formed with the junction areas; etching the interlayer dielectric to expose the junction areas and parts of the device isolation structure in front of and behind each of the junction areas; forming a first conductive material on each of the exposed junction areas, wherein each first conductive material extends over portions of the exposed parts of the device isolation structure in front of and behind the respective junction areas; etching the exposed parts of the device isolation structure in front of and behind each of the junction areas to form a recessed portion in front of and behind each junction area; and forming a second conductive material on the first conductive materials and in and over the recessed portions of the device isolation structure in front of and behind each respective junction area, thereby forming landing plugs including a stack of the first and the second conductive materials.

The step of etching the interlayer dielectric and the first conductive material is implemented using a mask pattern, and the mask pattern is used when etching the exposed parts of the isolation structure.

The step of etching the exposed parts of the device isolation structure is implemented such that portions of the device isolation structure adjacent to the junction areas remain unetched.

The recessed portions of the device isolation structure have a width in the range of 200~500 Å and a depth in the range of 500~1,500 Å.

After the step of etching the interlayer dielectric to expose the junction areas and before the step of forming the first conductive material on the exposed junction areas, the method further comprises the step of cleaning the exposed junction areas.

The first conductive material is formed as an epi-silicon layer using a selective epitaxial growth (SEG) process, and the second conductive material is formed as a highly doped polysilicon layer.

The highly doped polysilicon layer is formed to have a concentration in the range of $1 \times 10^{20} \sim 1 \times 10^{22}$ ions/cm$^3$.

DESCRIPTION OF SPECIFIC EMBODIMENTS

Hereafter, specific embodiments of the present invention will be described in detail with reference to the attached drawings.

Figure 1:
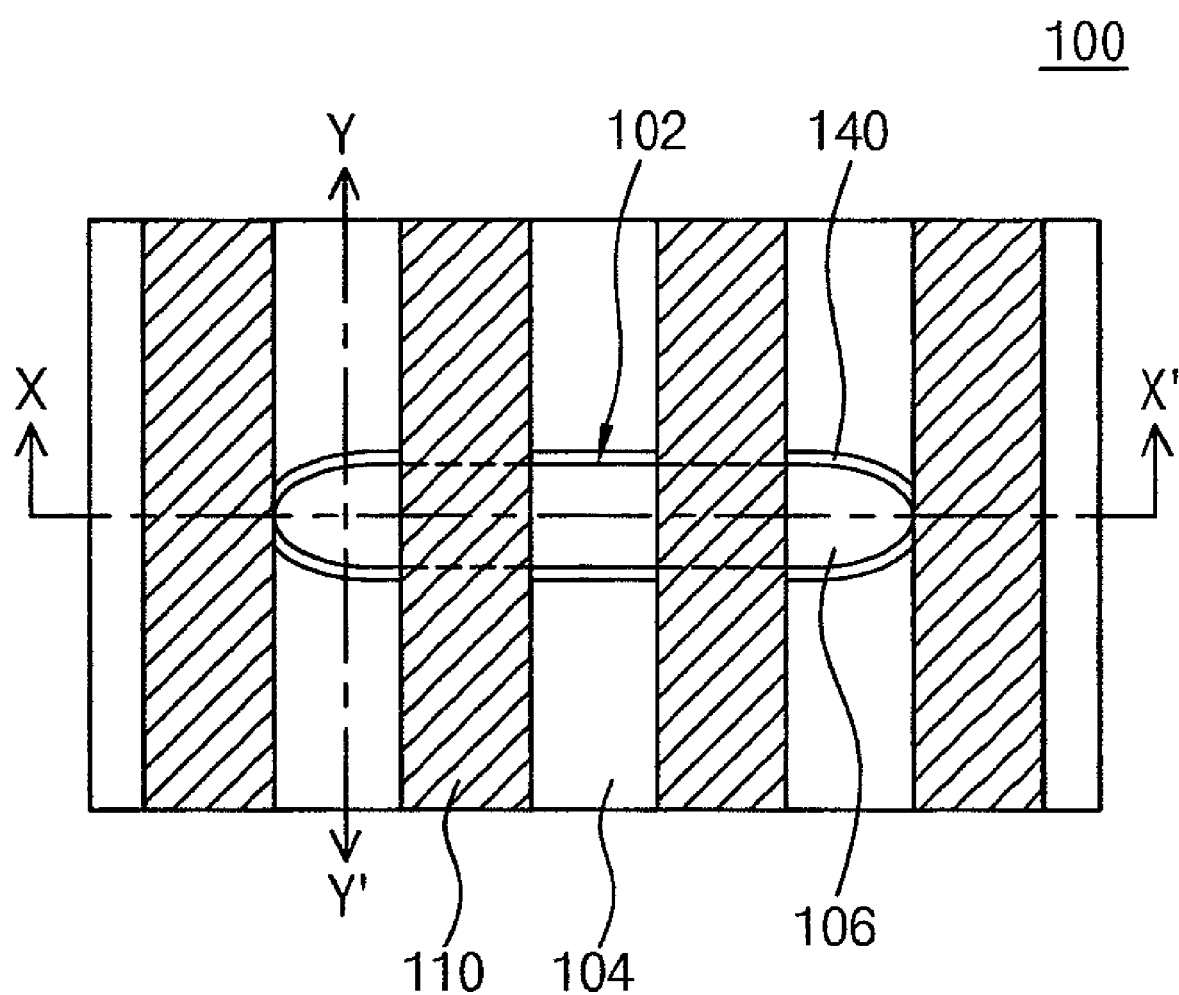
FIG. 1 is a plan view showing a semiconductor device in accordance with an embodiment of the present invention.
Figure 2A:
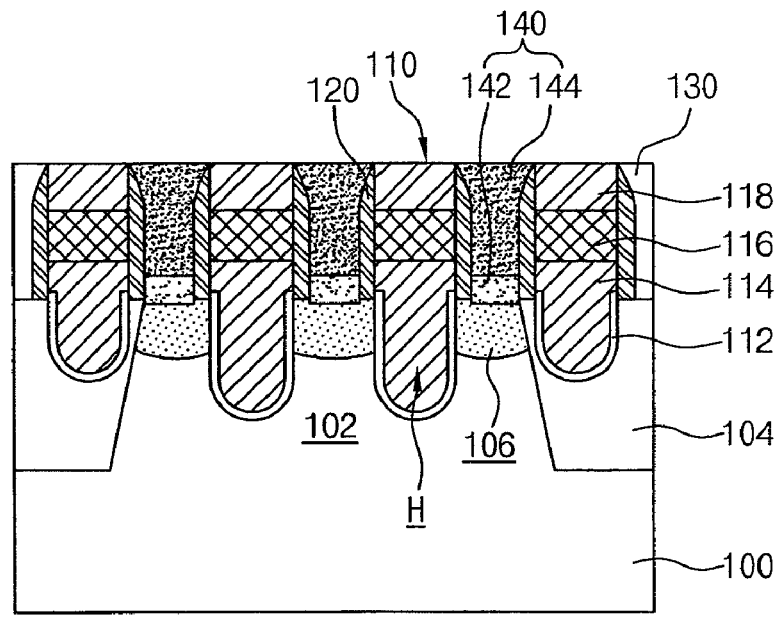
FIG. 2A is a sectional view taken along line X-X' of FIG. 1.
Figure 2B:
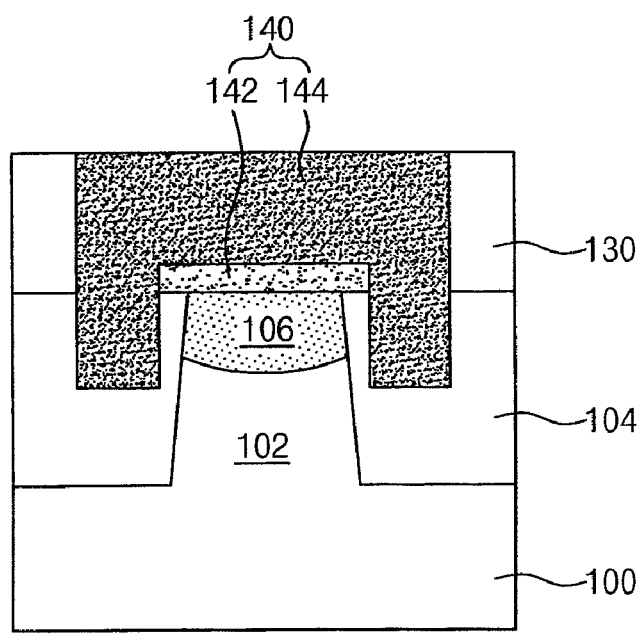
FIG. 2B is a sectional view taken along line Y-Y' of FIG. 1.

FIG. 1 is a plan view showing a semiconductor device in accordance with an embodiment of the present invention, and FIGS. 2A and 2B are sectional views taken along the lines X-X' and Y-Y' of FIG. 1 respectively.

Referring to these drawings, in a semiconductor device in accordance with an embodiment of the present invention, the channel forming areas of an active region 102 are recessed, and gates 110 are formed in and over the recessed channel areas, whereby a recessed channel structure is obtained. Junction areas 106 are formed on the surfaces of the active region 102 located on both sides of the gates 110. A device isolation structure 104 delimits the active region 102. Portions of the device isolation structure near the junction areas 106 are etched (see specifically FIG. 2B). Landing plugs 140 are formed on the junction areas 106 and on the etched portions of the device isolation structure 104 forming a shape enclosing the front and rear surfaces of each junction area 106.

In more detail, each landing plug 140 has a stacked structure of an epi-silicon layer 142 and a highly doped polysilicon layer 144. The epi-silicon layer 142 is a first conductive material and is formed on the junction area 106 and portions of the device isolation region 104 adjacent to the junction area 106. The highly doped polysilicon layer 144 is a second conductive material formed on the epi-silicon layer 142 and fills the etched portions of the device isolation structure 104. The highly doped polysilicon layer 144 encloses the front and rear surfaces of the junction area 106 in the lengthwise direction of each channel. The epi-silicon layer 142 is formed using a selective epitaxial growth (SEG) process, and the highly doped polysilicon layer 144 is formed to have a concentration in the range of $1 \times 10^{20} \sim 1 \times 10^{22}$ ions/cm$^3$.

As shown in FIG. 2B, the front and rear surfaces of the active region 102 have a positive slope, and the portions of the device isolation structure 104 adjacent to the junction area 106 of the active region 102 remain unetched. As such, the landing plug 140 is partially separated from the junction area 106, and portions of the device isolation structure 104 adjacent to the junction area 106 remain and are interposed between the junction area 106 and the landing plug 140.

In FIGS. 1, 2A and 2B, the reference numeral 100 designates a semiconductor substrate, 112 a gate insulation layer, 114 a polysilicon layer, 116 a metal-based layer, 118 a hard mask layer made of a nitride layer, 120 spacers, 130 an interlayer dielectric, and H a groove defined by recessing the channel forming area.

As described above, the semiconductor device according to the present invention has a structure including a highly doped polysilicon layer of a landing plug formed to enclose the front and rear surfaces of each junction area. The presence of the highly doped polysilicon layer suppresses interference caused by an adjoining gate. Therefore, in the present invention leakage current from a cell transistor is decreased leading to an improvement in the characteristics of the semiconductor device.

Additionally, in the present invention the highly doped polysilicon layer that encloses the front and rear surfaces of each junction area can be realized by merely adding a process of etching the device isolation structure to the process of forming landing plugs, and thus the highly doped polysilicon layer that encloses the front and rear surfaces of each junction area can be formed without substantially changing existing processes. Therefore, the present invention accomplishes simplification and stabilization of processes.

FIGS. 3A through 3D and 4A through 4D are sectional views shown for explaining the processes of a method for manufacturing a semiconductor device in accordance with another embodiment of the present invention. Here, FIGS. 3A through 3D are sectional views taken along line X-X' of FIG. 1, and FIGS. 4A through 4D are sectional views taken along line Y-Y' of FIG. 1.

Figure 3A:
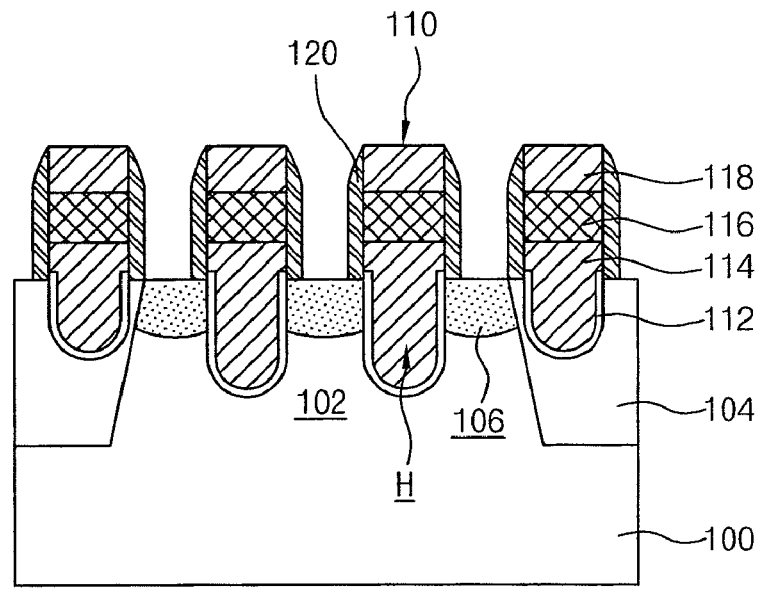
FIGS. 3A through 3D are sectional views taken along line X-X' of FIG. 1, shown for explaining the processes of a method for manufacturing a semiconductor device in accordance with an embodiment of the present invention.
Figure 4A:
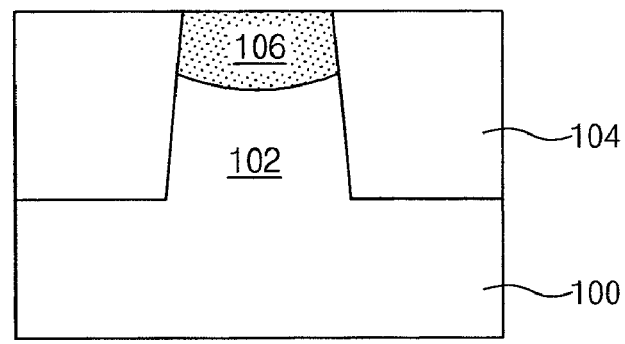
FIGS. 4A through 4D are sectional views taken along line Y-Y' of FIG. 1, shown for explaining the processes of the method for manufacturing a semiconductor device in accordance with another embodiment of the present invention.

Referring to FIGS. 3A and 4A, a device isolation structure 104 is formed in a semiconductor substrate 100 to delimit an active region 102. Channel forming areas of the active region 102 are selectively recessed to form grooves H. A gate insulation layer 112 is formed on the surfaces of the grooves H and on the surface of the active region 102. A polysilicon layer 114 is formed on the gate insulation layer 112 to fill the grooves H, and a metal-based layer 116 and a hard mask layer 118 made of a nitride layer are sequentially formed on the polysilicon layer 114. Then, the hard mask layer 118, the metal-based layer 116, the polysilicon layer 114, and the gate insulation layer 112 are etched to form gates 110 in and over the grooves H defined in the channel forming areas and on portions of the device isolation structure 104. Spacers 120 are formed on both sidewalls of the gates 110. Junction areas 106 are formed in the surface of the active region 102 on both sides of the gates 110 including in the surfaces of the active region 102 where the spacers 120 are formed, as a result of which a cell transistor is configured.

Figure 3B:
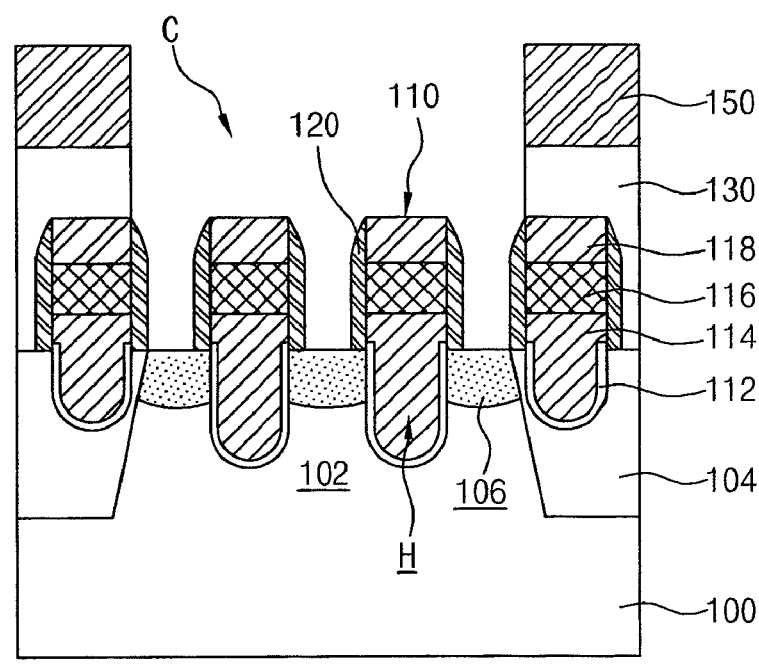
Figure 4B:
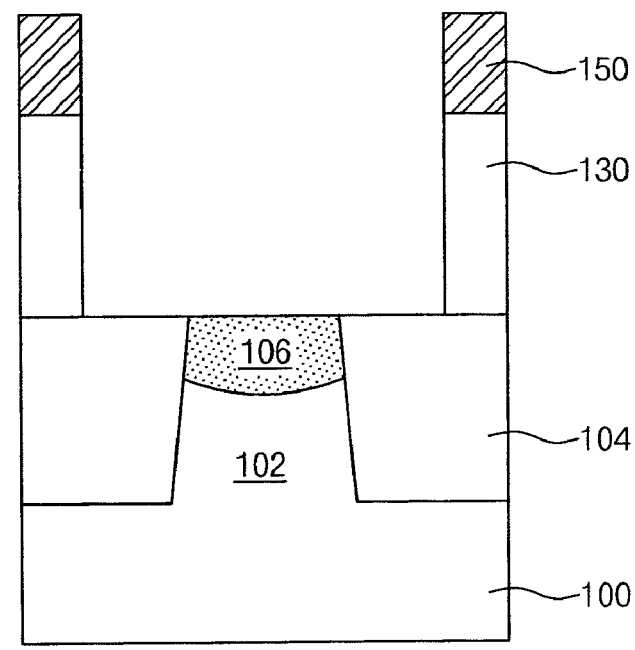

Referring to FIGS. 3B and 4B, an interlayer dielectric 130 is formed on the entire surface of the semiconductor substrate 100 formed with the cell transistor. A mask pattern 150 is formed on the interlayer dielectric 130 to expose a portion of the interlayer dielectric 130 formed on the gates 110 and the junction areas 106. The exposed portion of the interlayer dielectric 130 is etched using the mask pattern 150 as an etch mask to define a contact hole C for forming landing plugs. The contact hole C simultaneously exposes the gates 110 and the junction areas 106.

As seen in FIG. 4B, the mask pattern 150 is also formed to expose parts of the device isolation structure 104 located in front of and behind the junction areas 106 in the lengthwise direction of the channels. Each exposed part of the device isolation structure 104 has a predetermined width. As such, the contact hole C for forming landing plugs exposes the junction areas 106 and the parts of the device isolation structure 104 located in front of and behind the junction areas 106, when viewed in the lengthwise direction of the channels.

Figure 3C:
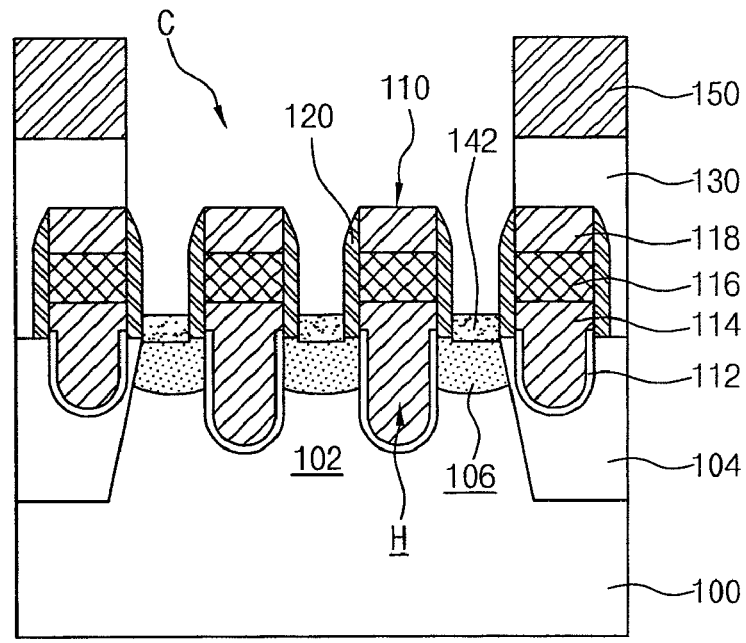
Figure 4C:
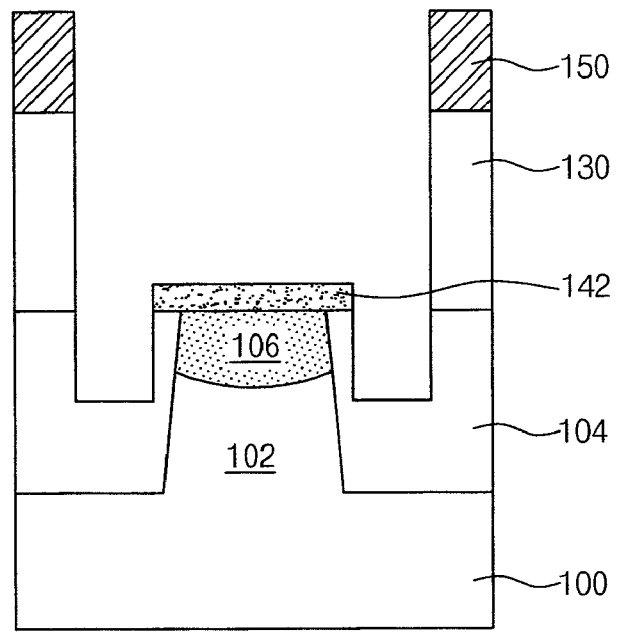

Referring to FIGS. 3C and 4C, with the mask pattern 150 remaining, the surfaces of the exposed junction areas 106 are cleaned. Thereafter, an epi-silicon layer 142 is grown on the cleaned junction areas 106 through an SEG (selective epitaxial growth) process. The SEG process causes growth of silicon to occur not only in an upward direction but also in a lateral direction, and thus the epi-silicon layer 142 is formed not only on the junction areas 106, but also on portions of the device isolation structure 104 which are adjacent to the junction areas 106.

In the present invention, the growing thickness of the epi-silicon layer 142 is adjusted such that the epi-silicon layer 142 does not grow on the entire exposed portion of the device isolation structure 104. Therefore, portions of the device isolation structure 104, which are separated from the junction areas 106 and have a preselected width, are exposed. For example, the epi-silicon layer 142 is grown to a thickness that allows the edge of the epi-silicon layer 142 to be separated from the edge of the contact hole C for forming landing plugs by 200~500 Å.

The exposed portions of the device isolation structure 104 are etched using the mask pattern 150 used when defining the contact hole C for forming landing plugs and the epi-silicon layer 142 as an etch mask. The exposed portions of the device isolation structure 104 are etched to have a width in the range of 200~500 Å and a depth in the range of 500~1,500 Å. As previously described, the epi-silicon layer 142 is formed not only on the junction areas 106, but also on the portions of the device isolation structure 104 adjacent to the junction areas 106. Therefore, the portions of the device isolation structure 104 adjacent to the junction areas 106 that are under the epi-silicon layer 142 are not etched and remain as they are.

Figure 3D:
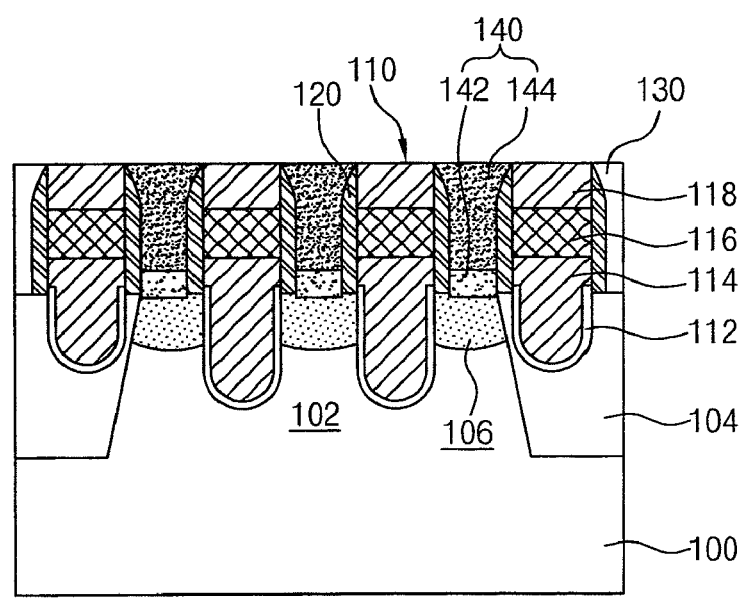
Figure 4D:
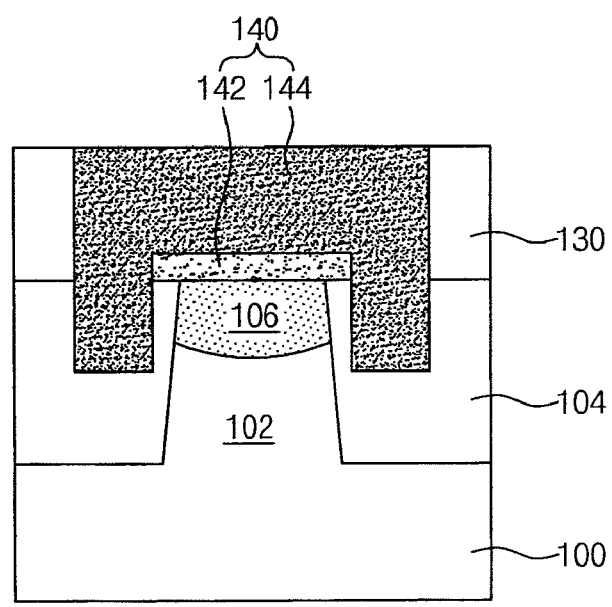

Referring to FIGS. 3D and 4D, the mask pattern 150 is removed. A highly doped polysilicon layer 144 is formed on the interlayer dielectric 130 to completely fill the contact hole C for forming landing plugs. Preferably, the concentration of the highly doped polysilicon layer 144 is set to $1\times10^{20}$~$1\times10^{22}$ ions/cm$^3$. Landing plugs 140 are formed by CMPing (chemically and mechanically polishing) the highly doped polysilicon layer 144 and the interlayer dielectric 130 until the hard mask layer 118 of the gates 110 is exposed. The landing plugs 140 are made of a stack of the epi-silicon layer 142 and the highly doped polysilicon layer 144 and are formed on the junction areas 106 between the gates 110. Since the highly doped polysilicon layer 144 is formed to fill the etched portions of the device isolation structure 104, the highly doped polysilicon layer 144 has a shape which encloses the front and rear surfaces of the junction areas 106. Therefore, the portions of the device isolation structure 104 adjacent to the junction areas 106 are interposed between the highly doped polysilicon layer 144 and the junction areas 106.

Thereafter, while not shown in the drawings, by sequentially implementing a series of well-known processes, the manufacturing process of the semiconductor device according to the present invention is completed.

As is apparent from the above description, the present invention provides advantages by forming a highly doped polysilicon layer around an active region, that is, a junction area. In the present invention, the presence of the highly doped polysilicon layer suppresses interference caused by an adjoining gate. Accordingly, in the present invention, the suppression of interference by an adjoining gate leads to a decrease in the leakage current from a cell transistor, whereby the characteristics of a semiconductor device are improved.

Although specific embodiments of the present invention have been described for illustrative purposes, those skilled in the art will appreciate that various modifications, additions, and substitutions are possible without departing from the scope and spirit of the invention as disclosed in the accompanying claims.

What is claimed is:

1. A semiconductor device comprising:
   a semiconductor substrate having an active region having a plurality of recessed channel areas extending across the active region and a plurality of junction areas also extending across the active region, wherein any two recessed channel areas or any two junction areas in the active region are not contiguous; gates formed in and over the recessed channel areas of the active region;
   a device isolation structure formed in the semiconductor substrate to delimit the active region, wherein the device isolation structure has recessed portions, each of which recessed portion of the device isolation structure outside the active region is formed near but separated from the junction area of the active region; and
   landing plugs, each of which is formed over each junction area in the active region and extends to fill the recessed portions of the device isolation structure outside the active region.

2. The semiconductor device according to claim 1, wherein a width of each recessed portion of the device isolation structure is in the range of 200~500 Å.

3. The semiconductor device according to claim 1, wherein a depth of each recessed portion of the device isolation structure is in the range of 500~1,500 Å.

4. The semiconductor device according to claim 1, wherein each of the landing plugs is formed of a stack comprising:
   a first conductive material formed on each junction area; and
   a second conductive material formed on the first conductive material and in and over the recessed portions of the device isolation structure.

5. The semiconductor device according to claim 4, wherein the first conductive material has a size greater than that of the junction area.

6. The semiconductor device according to claim 4, wherein the first conductive material comprises an epi-silicon layer, and the second conductive material comprises a doped polysilicon layer.

7. The semiconductor device according to claim 6, wherein the doped polysilicon layer has a concentration in the range of $1\times10^{20}$~$1\times10^{22}$ ions/cm$^3$.

8. The semiconductor device according to claim 5, wherein a portion of the device isolation structure is interposed between the junction area and the second conductive material.

* * * * *